United States Patent
Oravec

(12) 
(10) Patent No.: US 6,412,504 B1
(45) Date of Patent: Jul. 2, 2002

(54) RINSING TANK WITH ULTRA CLEAN LIQUID

(75) Inventor: Victoria Oravec, Grenoble (FR)

(73) Assignee: Vaco Microtechnologies, Varces Allieres et Rissnet (FR)

( * ) Notice: Subject to any disclaimer, the term of this patent is extended or adjusted under 35 U.S.C. 154(b) by 164 days.

(21) Appl. No.: 09/618,061

(22) Filed: Jul. 17, 2000

(30) Foreign Application Priority Data

Aug. 12, 1999 (FR) .............................. 99 10532

(51) Int. Cl.[7] .............. B08B 3/00; B08B 3/12; B08B 6/00
(52) U.S. Cl. ............. 134/182; 134/184; 134/186; 134/902
(58) Field of Search ............. 134/1, 1.3, 182, 134/184, 186, 198, 902

(56) References Cited

U.S. PATENT DOCUMENTS

| 5,415,698 A | * | 5/1995 | Fujinaga et al. ........... 134/25.1 |
| 5,651,836 A | * | 7/1997 | Suzuki ....................... 134/34 |
| 5,656,097 A | * | 8/1997 | Olesen et al. ................. 134/1 |
| 5,698,038 A | | 12/1997 | Guldi et al. .................. 134/1 |
| 5,881,748 A | * | 3/1999 | Suzuki ...................... 134/155 |
| 5,911,232 A | * | 6/1999 | Mokuo et al. ............... 134/1.3 |
| 6,138,698 A | * | 10/2000 | Tanaka et al. .............. 134/184 |
| 6,159,303 A | * | 12/2000 | Nadahara et al. ............. 134/10 |

FOREIGN PATENT DOCUMENTS

| JP | A-6-177104 | | 6/1994 |
| JP | 411012746 A | * | 1/1999 |

* cited by examiner

Primary Examiner—Randy Gulakowski
Assistant Examiner—Joseph Perrin
(74) Attorney, Agent, or Firm—Oliff & Berridge, PLC

(57) ABSTRACT

A rinsing tank for rinsing with ultra clean liquid comprises a rinsing chamber confined by an enclosure equipped at the bottom part with a diffusing device with a perforated base plate connected to a first pressurized cleaning liquid supply system, and with an overflow spout at the upper part. The periphery of the perforated base plate of the diffusing device is equipped with a plurality of projection nozzles or injectors connected to a second pressurized liquid supply system. The rising flow coming from the injectors causes a downward circulation of liquid designed to remove the contaminants and particles present at the surface of the substrates. The hydraulic piston effect generated by the first supply system of the base plate forces the rinsing liquid upwards towards the overflow spout. The tank may be used for rinsing of silicon, quartz, germanium, glass, etc. substrates commonly used in the semi-conductors, micro-systems and flat screen industries.

12 Claims, 6 Drawing Sheets

RINSING TANK WITH ULTRA CLEAN LIQUID

BACKGROUND OF THE INVENTION

The invention relates to a rinsing tank for rinsing with ultra clean liquid comprising a rinsing chamber confined by an enclosure equipped at the bottom part with a diffusing device with a perforated base plate connected to a first pressurized liquid supply system, and with an overflow spout at the upper part to receive the rinsing liquid charged with particles or contaminants removed from the objects to be rinsed.

STATE OF THE TECHNIQUE

A first type of known rinsing tank operates by overflow due to the presence of an overflow pipe at the top part of the tank. The rinsing chamber is filled with ultra clean deionized water up to the level of the overflow pipe. Filling is performed by means of a water inlet pipe situated in the central part of the bottom of the tank. The water flows out by overflowing into the overflow pipe and is removed by an outlet pipe. Rinsing of the substrates contained in the container inside the rinsing chamber is achieved by a simple filling effect of the tank. FIG. 3 of the document U.S. Pat. No. 5,485,861 describes such a device which requires a large volume of deionized water. The turbulence effect created in the rinsing chamber when the water rises disturbs the uniform circulation of the water to the detriment of the cleaning characteristics.

A second type of known rinsing tank operates by fast draining due to the presence of a removable flap in the bottom of the tank. The tank is first filled with deionized water and is then drained by gravity after the removable flap has been opened. The high speed of the downward water flow washes away the contaminant elements present on the substrates. This type of tank also requires a large consumption of deionized water.

The document U.S. Pat. No. 5,485,861 shows a similar device in FIGS. 1 and 2, but removal of the water takes place via holes arranged in the bottom of the tank which is connected to the outlet pipe.

OBJECT OF THE INVENTION

The object of the invention is to achieve rinsing tank for rinsing with an ultra clean liquid enabling optimum rinsing of the objects contained in the tank to be obtained with a small consumption of liquid.

The device according to the invention is characterized in that the rinsing chamber comprises in addition:

- a plurality of projection nozzles or injectors connected to a second pressurized liquid supply system, said nozzles being distributed along the periphery of the perforated base plate of the diffusing device,
- a deflector situated close to the overflow spout and having the form of a convergent to divert the rising flow coming from the nozzles to the central part of the rinsing chamber causing a downward circulation of liquid designed to remove the contaminants and particles,
- and means for reversing the flow due to the hydraulic piston effect generated by the first supply system of the base plate which forces the rinsing liquid upwards towards the overflow spout.

According to one feature of the invention, the deflector constitutes the internal face of the overflow spout and the enclosure comprises at least two inclined side faces extending between the base plate and the deflector. The nozzles or injectors can advantageously be directed inside the rinsing chamber either in the direction of the side faces of the enclosure or in another predetermined direction.

According to another feature of the invention, the base plate of the diffusing device bears a diverting element to direct the descending flows in the direction of the sides of the enclosure. The diverting element is in the form of a divergent extending in the central part of the base plate, and presents a prismatic shape having a base resting on the base plate and a peak directed towards the objects to be rinsed.

The objects to be rinsed are constituted by substrates commonly encountered in the semi-conductor, microsystems and flat screen industries, notably silicon-, AsGa-, germanium-, quartz-, or glass-based, or such like, which substrates being arranged in parallel manner in a container inside the rinsing chamber.

According to another feature of the invention, sonic antennas generate acoustic vibrations in the rinsing liquid.

BRIEF DESCRIPTION OF THE DRAWINGS

Other advantages and features of the invention will become more clearly apparent from the following description of an embodiment of the invention given as a non-restrictive example only and represented in the accompanying drawings in which.

DESCRIPTION OF PREFERRED EMBODIMENTS

Figure 1:
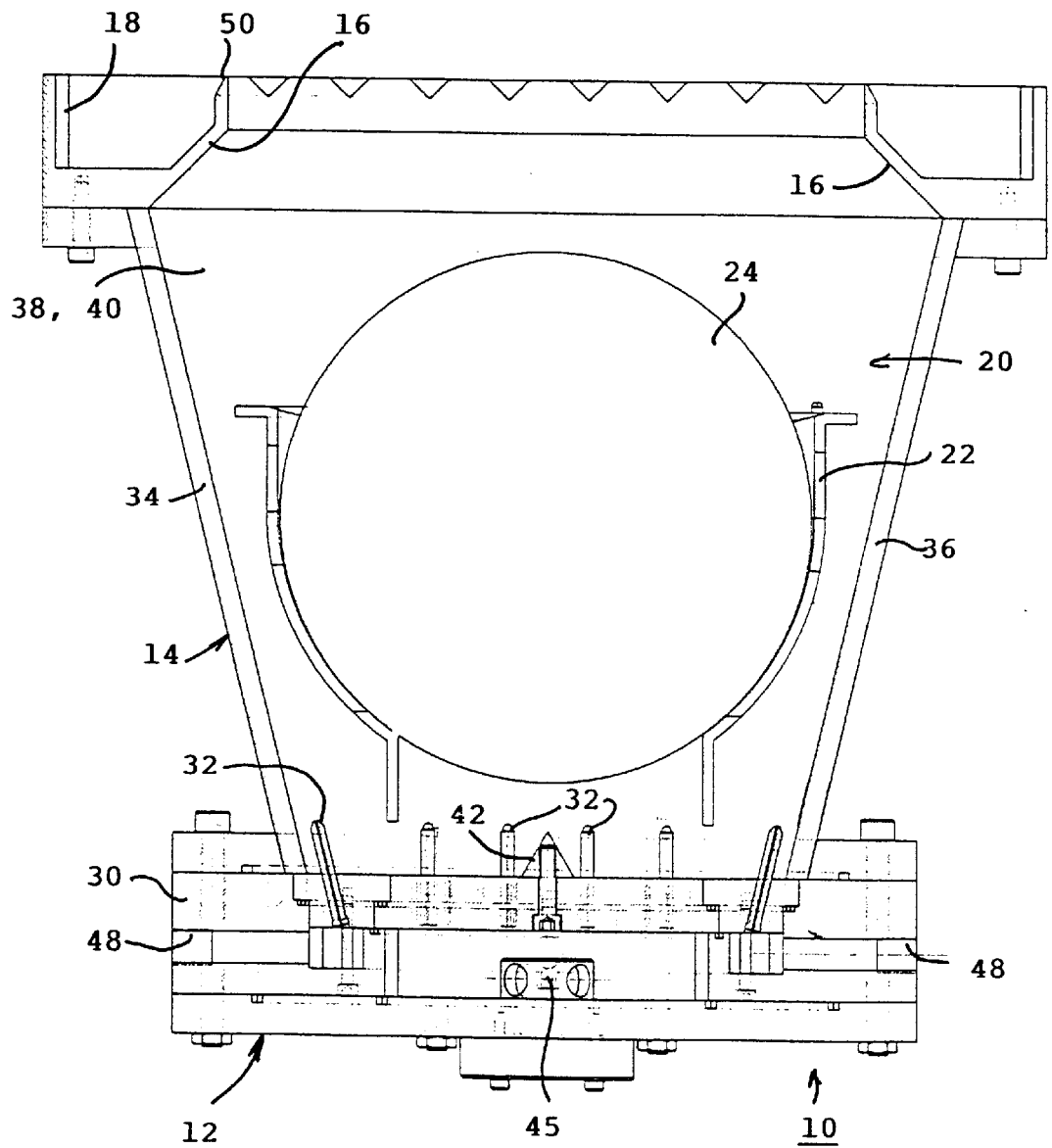
FIG. 1 is a cross sectional view of the rinsing tank according to the invention.
Figure 2:
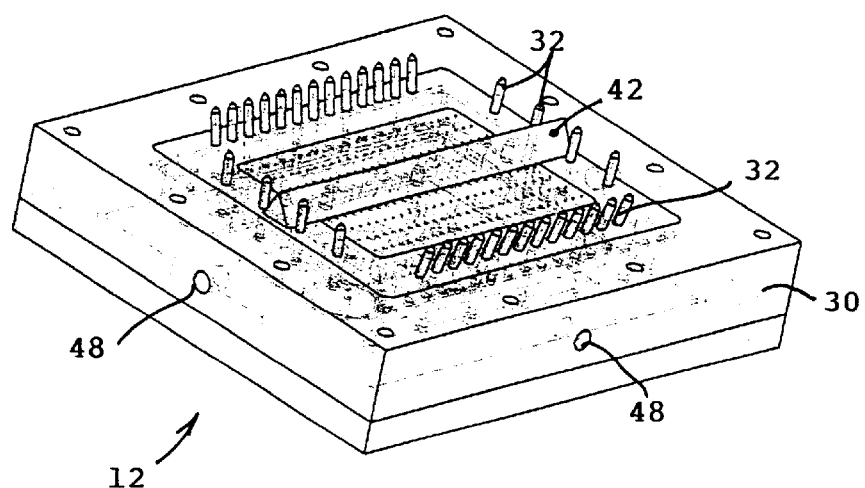
FIG. 2 shows a perspective view of the diffusing device arranged at the base of the tank of FIG. 1.
Figure 3:
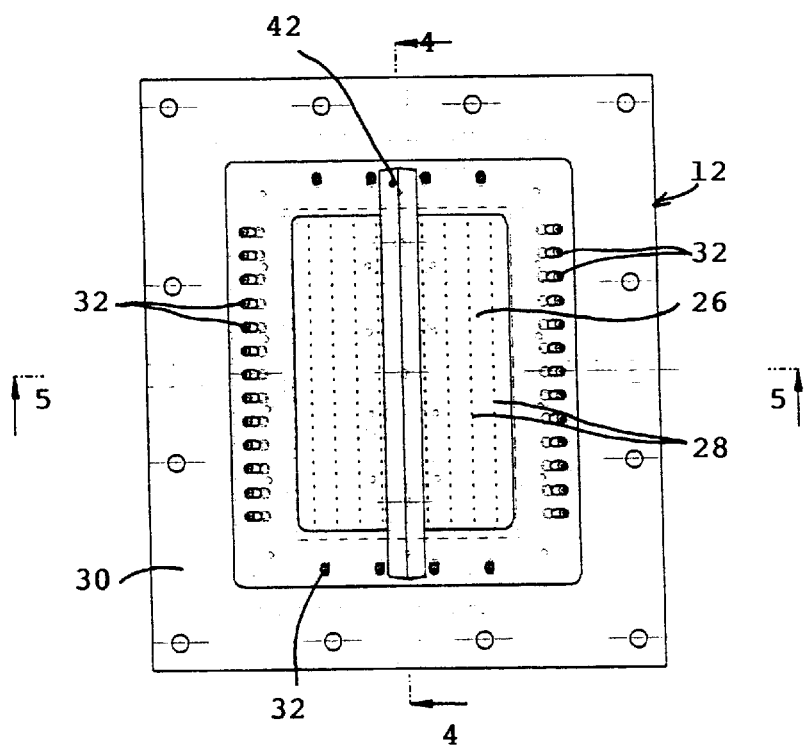
FIG. 3 is a plan view of FIG. 2.
Figure 4:
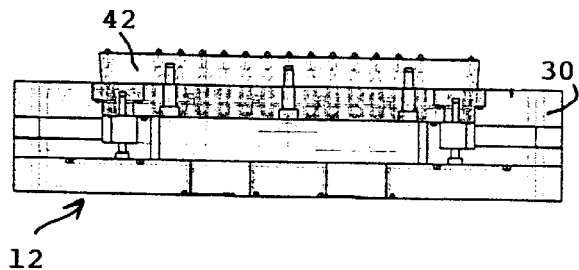
FIGS. 4 and 5 represent cross sectional views along the lines 4—4 and 5—5 of FIG. 3.
Figure 5:
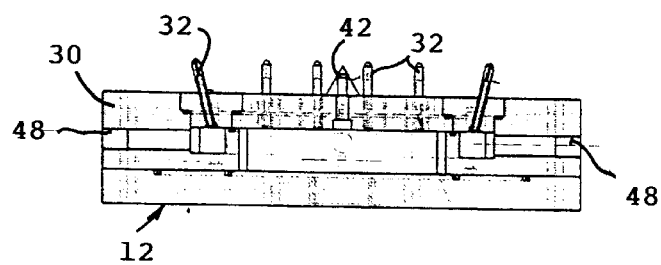

With reference to FIGS. 1 to 5, the rinsing tank 10 comprises at its base a diffusing device 12 for diffusing an ultra clean liquid, for example deionized water, to which an enclosure 14 is connected equipped at its top part with a deflector 16 and an overflow spout 18. Inside the rinsing chamber 20 confined by the enclosure 14 there is located a container 22 accommodating substrates 24 to be rinsed.

The water diffusing device 12 is composed of a base plate 26 perforated by several rows of holes 28 placed under the container 22, and of a peripheral flange 30 bearing a plurality of water projection nozzles 32. The enclosure 14 comprises two side faces 34, 36 inclined at a predetermined angle and joined to two parallel vertical faces 38, 40. The nozzles 32 are staggered along the flange 30 extending in the direction of the four faces 34, 36, 38, 40 of the tank. Depending on the type of rinsing chamber, the nozzles 32 situated on the side where the faces 38, 40 are located can be eliminated.

A diverting element 42 in the form of a divergent is fixed to the base plate 26 to direct the descending flows towards the inclined sides of the rinsing tank 10. The diverting element 42 of prismatic shape extends in the central part of the base plate 26 in a parallel manner to the two side faces 34, 36. The base of the prism is supported by the base plate 26 and the peak is directed towards the base of the container 22.

A first water supply system 44 is connected to at least one inlet orifice 45 connected to the base plate 26 and a second water supply system 46 is connected to inlet orifices 48 connected to the nozzles 32 of the flange 30.

The deflector 16 forms an integral part of the internal face of the overflow spout 18 and constitutes a convergent forming an obtuse angle with the side faces 34, 36 of the enclosure 14. The deflector 16 serves the purpose of directing the rising flows originating from the nozzles 32 towards the centre of the rinsing chamber 20 in a downwards circular movement.

The overflow spout 18 receives the used rinsing water and is connected by a pipe either to the drainage system or to a recycling plant.

Figure 6:
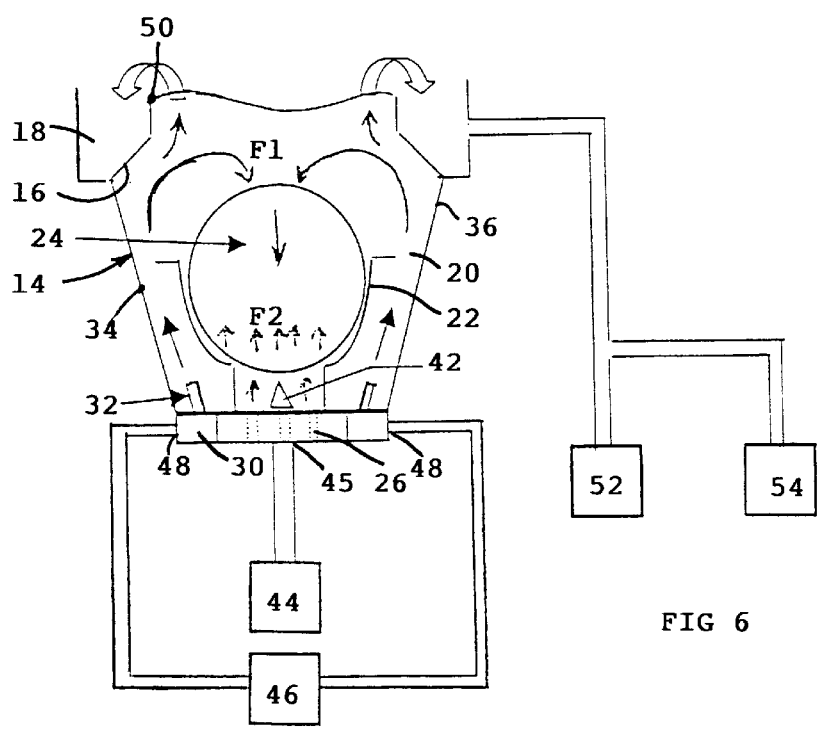
FIG. 6 illustrates the operating principle of the rinsing tank of FIG. 1.

The rinsing cycle is illustrated in FIG. 6 and is performed in the following manner:

The rinsing chamber 20 is permanently filled with ultra clean liquid, for example water, up to the overflow pipe 50 of the spout 18 by means of a low water flow rate both from the holes 28 of the perforated base plate 26 of the first water supply system 44 and from the nozzles 32 of the second water supply system 46. Before the container 22 containing the substrates 24 to be rinsed is inserted, the flow rate of the nozzles 32 or of the base plate 26 is increased to renew the surface of the water eliminating any particles of dust or impurity.

The container 22 with the substrates 24 is then placed in the rinsing chamber 20 and the first water supply valve of the nozzles 32 is then opened to obtain a predetermined water flow rate at the outlet of the lateral nozzles 32. The water jets follow the internal walls of the side faces 34, 36, 38, 40 of the enclosure 14 and are diverted in the upper part by the convergent deflector 16 creating circulatory flows according to the arrows F1. This results in a downwards water flow designed to remove the contaminants and particles present at the surface of the substrates 24.

The removed contaminants and particles are contained in the rinsing liquid. After a rinsing time of about more or less one minute, the first supply valve of the nozzles 32 is closed and the second supply valve of the perforated base plate 26 is then opened enabling pressurized clean water to be inlet via the bottom. The movement of the water is then reversed due to the hydraulic piston effect which forces the waste water containing the contaminants upwards in the direction of the arrow F2. The waste water overflows into the overflow spout 18 whence it is transported to the drain 52.

After a certain rinsing time via the perforated base plate 26 of the first water supply system 44, the second supply valve is closed and the same process is started again during one or more additional cycles.

At the end of rinsing by hydraulic piston effect, the container 22 with the clean substrates 24 is removed. The rinsing tank is again supplied with a small flow rate of rinsing liquid until a new substrate rinsing cycle is performed. The contaminated water may be transported to the deionized water plant 54 to be recycled.

The alternate movements of the liquid caused by the nozzles 32 of the second supply system 46 and by the hydraulic piston effect due to the perforated base plate 26 of the first supply system 44 enable optimum rinsing to be achieved with a very small consumption of liquid and a short cycle time.

Figure 7:
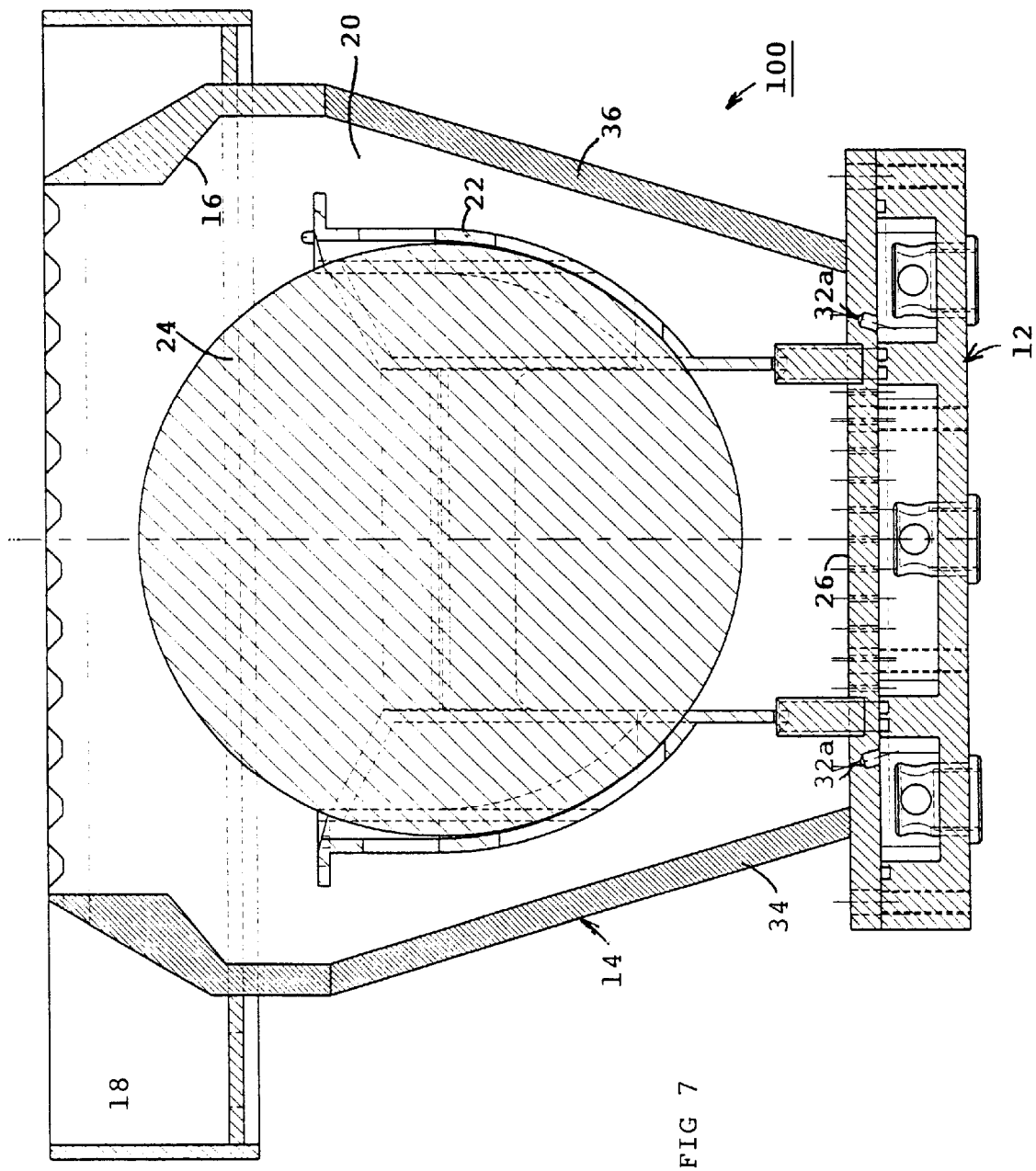
FIG. 7 is an identical view to FIG. 1 illustrating an alternative embodiment of the rinsing tank.
Figure 8:
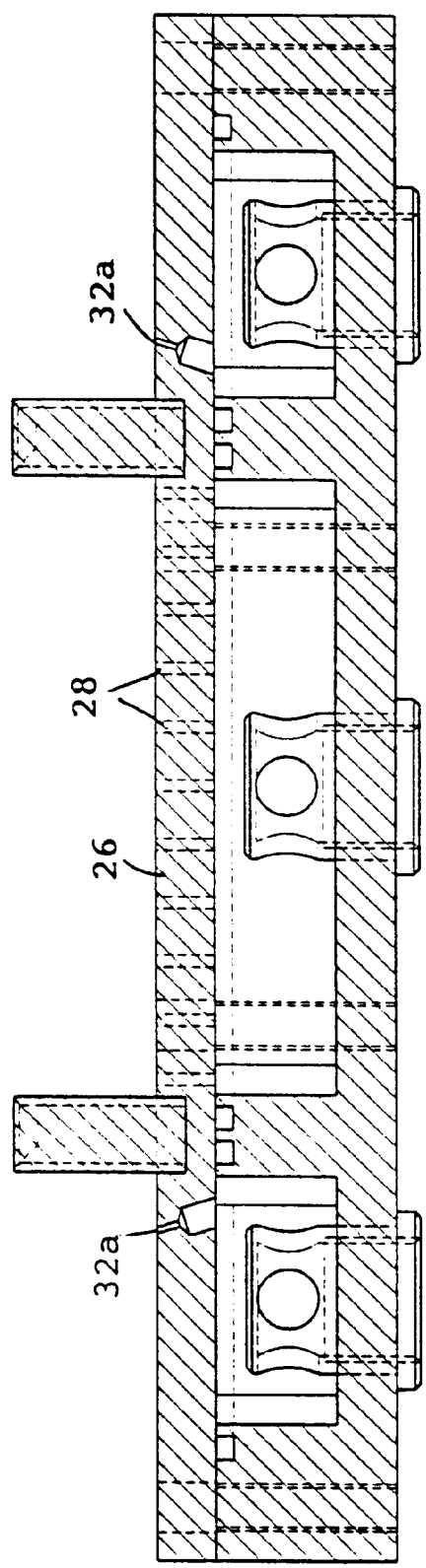
FIG. 8 shows a cross sectional view of the water supply system of the rinsing tank of FIG. 7.
Figure 9:
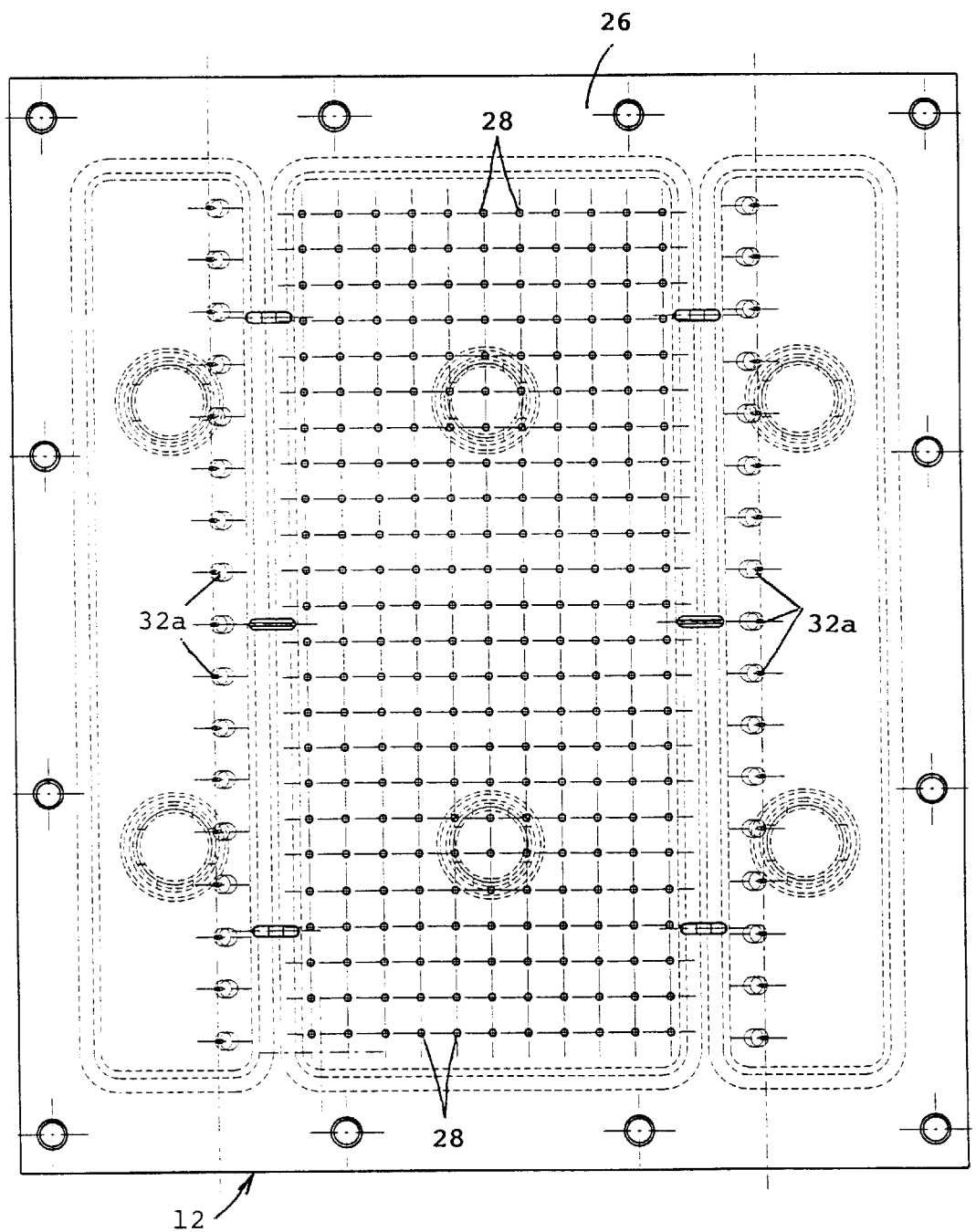
FIG. 9 is a plan view of the diffusing base plate of FIG. 7.

In the alternative embodiment of the rinsing tank 100 of FIGS. 7 to 9, the nozzles 32 are eliminated in the base plate 26 and are replaced by injectors 32a formed by simple calibrated holes connected to the second water supply system 46. The diverting element 42 is also eliminated in the central part of the diffusing base plate 26.

Sonic antennas may be used to generate acoustic vibrations in the rinsing liquid.

It is of course possible to reverse the rinsing cycle by using first the hydraulic piston effect.

What is claimed is:

1. A rinsing tank for rinsing with ultra clean liquid comprising:

a rinsing chamber confined by an enclosure equipped at the bottom part with a diffusing device with a perforated base plate connected to a first pressurized liquid supply system, and with an overflow spout at the upper part to receive a rinsing liquid charged with particles or contaminants removed from objects to be rinsed, a plurality of projection means connected to a second pressurized liquid supply system, and distributed along the periphery of the perforated base plate of the diffusing device, a deflector situated close to the overflow spout and having the form of a convergent to divert rising flows coming from the projection means to the central part of the rinsing chamber causing a downward circulation of liquid designed to remove the contaminants and particles, and means for reversing the flow due to the hydraulic piston effect generated by the first supply system of the base plate which forces the rinsing liquid upwards towards the overflow spout.

2. The rinsing tank according to claim 1, wherein the deflector constitutes an internal face of the overflow spout.

3. The rinsing tank according to claim 1, wherein the enclosure comprises at least two inclined side faces extending between the base plate and the deflector.

4. The rinsing tank according to claim 1, wherein the projection means are formed by nozzles or injectors directed in a predetermined direction inside the rinsing chamber.

5. The rinsing tank according to claim 1, wherein the base plate of the diffusing device bears a diverting element to direct the descending flows towards at least two sides of the enclosure.

6. The rinsing tank according to claim 5, wherein the diverting element is in the form of a divergent extending in the central part of the base plate.

7. The rinsing tank according to claim 6, wherein the diverting element presents a prismatic shape having a base resting on the base plate and a peak directed towards the objects to be rinsed.

8. The rinsing tank according to claim 1, wherein the objects to be rinsed are flat and arranged in parallel manner in a container inside the rinsing chamber.

9. The rinsing tank according to claim 8, wherein the objects are constituted by semi-conductor substrates, microsystems or flat screens.

10. The rinsing tank according to claim 1, wherein sonic antennas generate acoustic vibrations in the rinsing liquid.

11. The rinsing tank according to claim 9, wherein the micro-systems are made of quartz or silicon.

12. The rinsing tank according to claim 9, wherein the flat screens are made of glass.

* * * * *